(12) United States Patent
Perlberg et al.

(10) Patent No.: US 6,715,658 B2
(45) Date of Patent: Apr. 6, 2004

(54) ULTRA FINE PITCH CAPILLARY

(75) Inventors: Gil Perlberg, Yakov (IL); Ziv Atsmon, Zihron-Yakov (IL); Benjamin Sonnenreich, Haifa (IL); Arie Bahalui, Yokneam Elite (IL)

(73) Assignee: Kulicke & Soffa Investments, Inc., Wilmington, DE (US)

( * ) Notice: Subject to any disclaimer, the term of this patent is extended or adjusted under 35 U.S.C. 154(b) by 0 days.

(21) Appl. No.: 09/907,191

(22) Filed: Jul. 17, 2001

(65) Prior Publication Data

US 2003/0015567 A1 Jan. 23, 2003

(51) Int. Cl.[7] .................. B23K 37/00; B23K 31/02; B23K 11/16
(52) U.S. Cl. .................. 228/4.5; 228/180.5; 228/1.1; 219/56.21; 219/56.22
(58) Field of Search .................. 228/4.5, 180.5, 228/1.1; 219/56.21, 56.22

(56) References Cited

U.S. PATENT DOCUMENTS

| | | | |
|---|---|---|---|
| 3,917,148 A | * 11/1975 | Runyon | 228/54 |
| 3,971,499 A | * 7/1976 | Goodrich et al. | 228/54 |
| 4,405,074 A | * 9/1983 | Levintov et al. | 228/4.5 |
| 4,821,944 A | 4/1989 | Tsumura | |
| 4,974,767 A | * 12/1990 | Alfaro et al. | 228/4.5 |
| 5,421,503 A | * 6/1995 | Perlberg et al. | 228/180.5 |
| 5,437,405 A | * 8/1995 | Asanasavest | 228/1.1 |
| 5,465,899 A | 11/1995 | Quick et al. | |
| 5,558,270 A | * 9/1996 | Nachon et al. | 228/180.5 |
| 5,662,261 A | * 9/1997 | Fogal | 228/4.5 |
| 5,871,141 A | * 2/1999 | Hadar et al. | 228/180.5 |
| 5,906,308 A | 5/1999 | Yamazaki et al. | |
| 5,931,368 A | * 8/1999 | Hadar et al. | 228/4.5 |
| 5,954,260 A | 9/1999 | Orcutt | |
| 5,984,162 A | * 11/1999 | Hortaleza et al. | 228/110.1 |
| 6,065,667 A | 5/2000 | Singh | |
| 6,155,474 A | 12/2000 | Orcutt | |
| 6,213,378 B1 | 4/2001 | Singh | |
| 6,325,269 B1 | * 12/2001 | Suzuki et al. | 228/1.1 |
| 6,354,479 B1 | * 3/2002 | Reiber et al. | 219/56.21 |
| 2001/0005054 A1 | * 6/2001 | Higashi et al. | 228/4.5 |
| 2001/0045443 A1 | * 11/2001 | Miller et al. | 228/4.5 |
| 2002/0010069 A1 | 1/2002 | Shinji et al. | |
| 2002/0033408 A1 | * 3/2002 | Miller et al. | 228/4.5 |
| 2002/0096551 A1 | * 7/2002 | Reiber et al. | 228/4.5 |
| 2002/0158374 A1 | * 10/2002 | Billiet et al. | 264/669 |

FOREIGN PATENT DOCUMENTS

| | | | |
|---|---|---|---|
| EP | 0622149 | | 11/1994 |
| EP | 0834919 | | 4/1998 |
| JP | 63-239959 A | * | 10/1988 |
| JP | 04-149065 A | * | 5/1992 |
| JP | 09-162223 A | * | 6/1997 |
| JP | 11-186315 A | * | 7/1999 |
| JP | 11-251357 A | * | 9/1999 |
| KR | 2001/068181 A | * | 7/2001 |
| KR | 2001-068181 A | * | 7/2001 |
| WO | WO98/49121 | | 11/1998 |

OTHER PUBLICATIONS

International Search Report dated Feb. 28, 2003, application No. PCT/US 02/16663.

\* cited by examiner

*Primary Examiner*—Lynne Edmondson
(74) *Attorney, Agent, or Firm*—RatnerPrestia (57) ABSTRACT

A bonding tool for bonding a fine wire to bonding pads having a very fine pitch is disclosed. The bonding tool comprises a working tip at an end thereof. The working tip includes i) a tapered section having a predetermined angle with respect to the longitudinal axis of the first cylindrical section, ii) a working face with a first annular chamfer formed at an outside portion of an end of the working tip and, iii) a second annular chamfer formed at an inside portion of the end of the working tip. The first and second annular chamfer adjacent one another and a substantially cylindrical axial passage coupled to an upper portion of the second annular chamfer. The bonding tool is formed from a material containing at least 80% $ZrO_2$ by weight.

32 Claims, 8 Drawing Sheets

ULTRA FINE PITCH CAPILLARY

BACKGROUND OF THE INVENTION

This invention relates generally to a tool for use in the bonding of wire to semiconductor devices and, more particularly to a bonding tool for bonding of fine wire to bonding pads set at a very fine pitch.

DESCRIPTION OF THE RELATED ART

Modern electronic equipment relies heavily on printed circuit boards on which semiconductor chips, or integrated circuits (ICs), are mounted. The mechanical and electrical connections between the chip and the substrate have posed challenges for chip designers. Three well known techniques for interconnecting the IC to the substrate are: wire bonding, tape automated bonding (TAB) and flip-chip.

The most common of these processes is wire bonding. In wire bonding, a plurality of bonding pads are located in a pattern on the top surface of the substrate, with the chip mounted in the center of the pattern of bonding pads, and the top surface of the chip facing away from the top surface of the substrate. Fine wires (which may be aluminum or gold wires) are connected between the contacts on the top surface of the chip and the contacts on the top surface of the substrate. Particularly, the connecting wires are supplied and bonded to the chip and to the substrate through a capillary, a bonding tool further described below.

Capillaries (bonding tools) are used for ball bonding the wire to electronic devices, particularly to bond pads of semiconductor devices. Such capillaries are generally formed from a ceramic material, principally aluminum oxide, tungsten carbide, ruby, zircon toughened alumina (ZTA), alumina toughened zircon (ATZ). Very thin wire, generally on the order of about one mil gold, copper or aluminum wire, is threaded through an axial passage in the capillary with a small ball being formed at the end of the wire, the ball being disposed external of the capillary tip. The initial object is to bond the ball to a pad on the semiconductor device and then to bond a portion farther along the wire to a lead frame or the like. During the bonding cycle, the capillaries perform more than one function.

After the ball is formed, the capillary must first center the ball partly within the capillary for bond pad targeting. With a first bonding step, the ball is bonded to a pad on a semiconductor device. When the capillary touches the ball down on the bond pad, the ball will be squashed and flatten out. As the bond pads are generally made from aluminum, a thin oxide forms on the surface of the bond pad. In order to form a proper bond, it is preferable to break the oxide surface and expose the aluminum surface. An effective way of breaking the oxide is to "scrub" the surface of the oxide with the wire ball. The wire ball is placed on the surface of the aluminum oxide and the capillary rapidly moves in a linear direction based on the expansion and contraction of a piezo-electric element placed within the ultrasonic horn to which the capillary is attached. The rapid motion, in addition to heat applied through the bond pad, forms an effective bond by transferring molecules between the wire and the bond pad.

The capillary then handles the wire during looping, smoothly feeding the bond wire both out of the capillary and then back into the capillary. The capillary then forms a "stitch" bond and a "tack" or "tail" bond.

Presently, thermosonic wire bonding is the process of choice for the interconnection of semiconductor devices to their supporting substrates. The thermosonic bonding process is partially dependent upon the transfer of ultrasonic energy from the transducer, attached to a movable bondhead, through a tool, e.g. capillary or wedge, to the ball or wire being welded to the semiconducting device or supporting substrate.

In conventional capillaries (bonding tools), the geometry of the bonding tool and the free air ball (FAB) formed thereby are such that the bonding tool can only be used to bond wires to bonding pads having an interpad spacing (pitch) of greater than 60 microns (0.060 mm; $15.34*10^{-4}$ in.]. Thus, making them unsuitable for bonding wires to devices produced to meet the higher density requirements of the semiconductor industry. These prior art bonding tools are also unsuitable for handling wire bonds using wire as small a 0.4 mils (10 microns) in diameter. The inventors of the present invention have developed a bonding tool that meets the demands imposed by these high-density devices while maintaining structural integrity of the bonding tool.

Figure 1A:
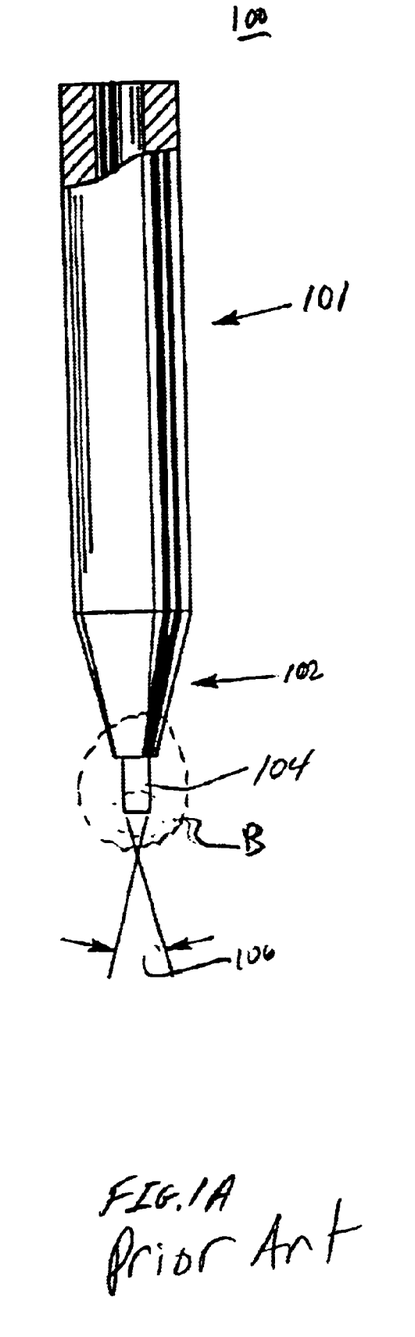
FIGS. 1A and 1B are various side views of a conventional bonding tool.

FIG. 1A is an illustration of a well-known prior art fine pitch bonding tool 100. Bonding tool 100 has a cylindrical portion 101, and a tapered potion 102 coupled between cylindrical portion 101 and working tip 104. Working tip 104 (at an end of bonding tool 100) has a tip angle of fifteen degrees relative to the longitudinal axis of bonding tool 100. In other words, working tip 104 has an overall angle 106 of 30 degrees. The reduced width of working tip 104 relative to cylindrical portion 101 permits ball bonds to be made on pads having a pitch of about 0.0032 in. without working tip 104 touching an adjacent loop of a bonded wire as explained in U.S. Pat. No. 5,558,270.

Figure 1B:
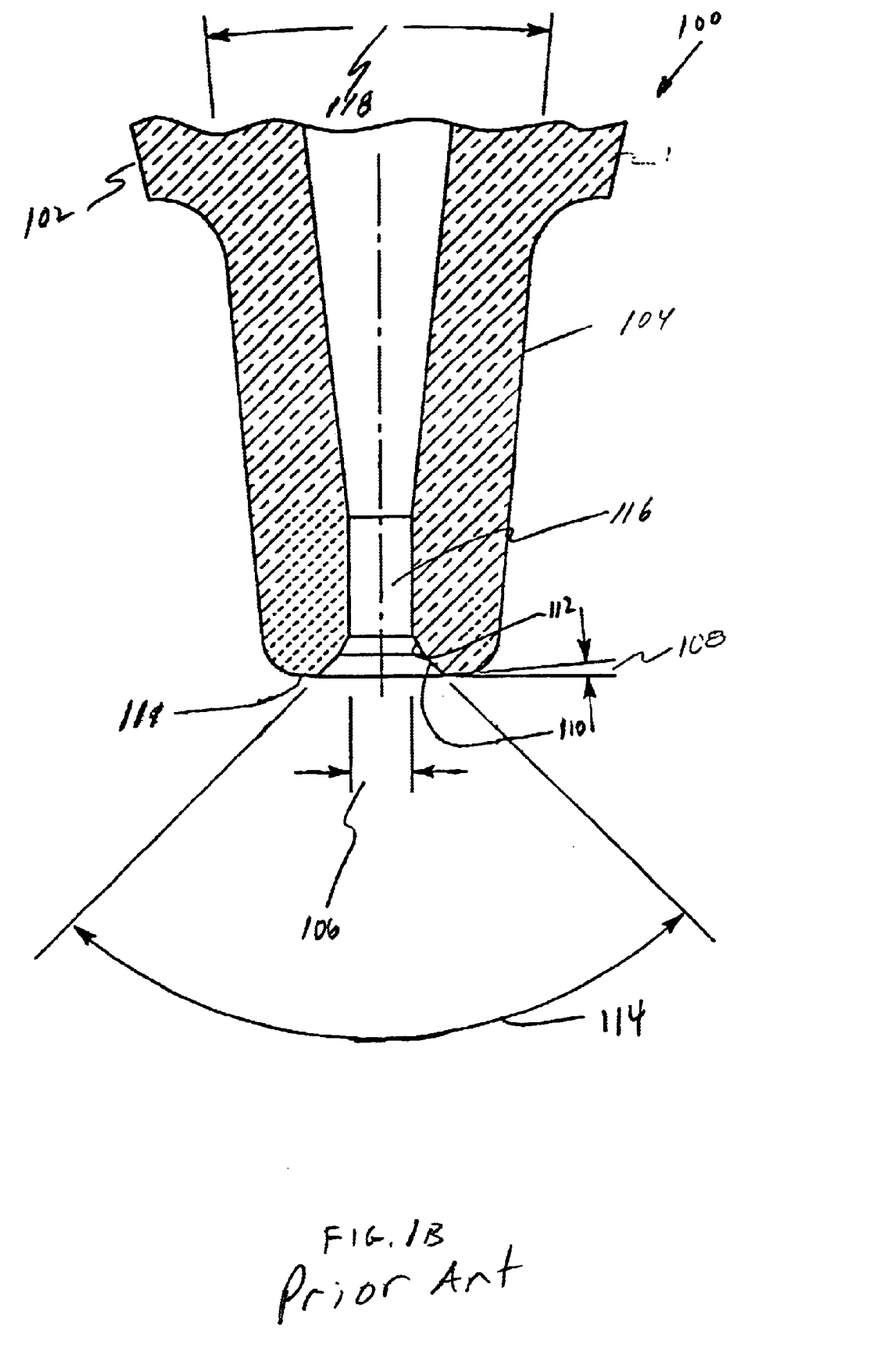

FIG. 1B is an illustration of an enlarged sectional view of working tip 104. As shown in FIG. 1B, working face 111 has a face angle 108 of 4 degrees, and tapered portion 104 has an overall angle 118 of 10 degrees. In addition, adjacent working face 111 is first inner chamfer 110, which, in turn, is adjacent second inner chamfer 112. First inner chamfer 110 has chamfer angle 114 of 90 degrees, and connects or continues with second inner chamfer 112 having an angle greater than 60 degrees. These chamfers are designed to guide a fine wire (not shown) into wire hole 116, having a diameter 106, to accommodate wire with a diameter of about 1 mil.

These prior art bonding tool are deficient, however, in that their design is not able to accommodate the ultra fine pitch (30 microns or less) bonding pad requirements placed upon the industry by semiconductor manufacturers. Further, these bonding tools are formed from materials that are unable to withstand the forces and meet the elasticity requirements necessary to provide a bonding tool with working tip dimensions sufficient to meet the needs of the semiconductor industry.

SUMMARY OF THE INVENTION

To solve the aforementioned disadvantages of conventional bonding tools, the present invention relates to having a working tip with a diameter less than 39 microns.

The bonding tool comprises a working tip at an end of the bonding tool. The working tip including i) a tapered section having a predetermined angle with respect to the longitudinal axis of the first cylindrical section, ii) a working face with a first annular chamfer formed at an outside portion of an end of the working tip, and iii) a second annular chamfer formed at an inside portion of the end of the working tip, the first and second annular chamfer being adjacent one another; and a substantially cylindrical axial passage coupled to an upper portion of the second annular chamfer.

According to another aspect of the present invention, the second annular chamfer has an overall angle of less than 90°.

According to a further aspect of the present invention, the first annular chamfer has a face angle of greater than 8°.

According to another aspect of the present invention, the bonding tool is formed from a material containing at least 80% $ZrO_2$ by weight.

According to yet another aspect of the present invention, the bonding tool is formed from a material selected from one of group consisting of i) $ZrO_2+Y_2O_3$ and ii) $Al_2O_3+ZrO_2+Y_2O_3$.

These and other aspects of the invention are set forth below with reference to the drawings and the description of exemplary embodiments of the invention.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following Figures.

DETAILED DESCRIPTION

The present invention overcomes the deficiencies of conventional capillary bonding tools by providing a bonding tool having a working tip including a tapered section having a predetermined angle with respect to the longitudinal axis of the first cylindrical section, ii) a working face with a first annular chamfer formed at an outside portion of an end of the working tip, and iii) a second annular chamfer formed at an inside portion of the end of the working tip, the first and second annular chamfer adjacent one another; and a substantially cylindrical axial passage coupled to an upper portion of the second annular chamfer. The resultant bonding tool is able to apply bonding wire of as small as 10 microns to bonding pads having a pitch of 30 microns or less.

Figures 2A, 2B:
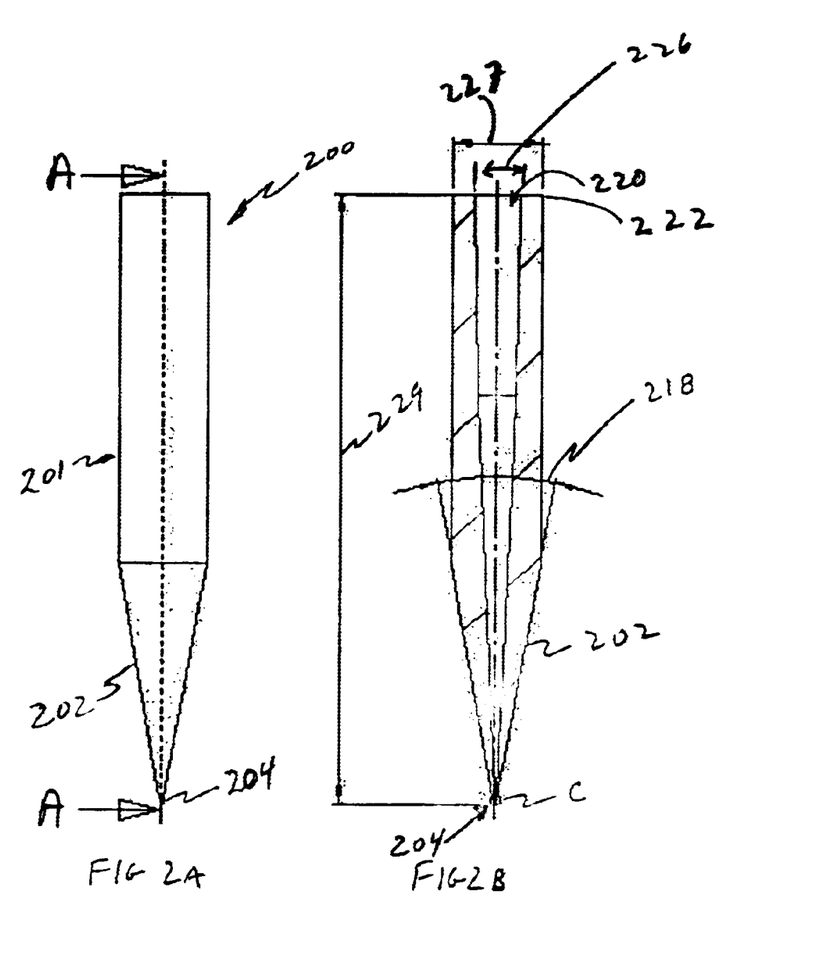
FIGS. 2A–2F are various views of a bonding tool according to a first exemplary embodiment of the present invention.

FIG. 2A is a side view of a bonding tool 200 according to a first exemplary embodiment of the present invention. As shown in FIG. 2A, bonding tool 200 has a cylindrical body portion 201, a tapered portion 202 coupled to the end of cylindrical body portion 201, and a working tip 204 coupled to the end of tapered portion 202. In a preferred embodiment, bonding tool 200 is formed from a unitary piece of material. The specifics of the material used to form the bonding tool are discussed in detail below.

Figure 2C:
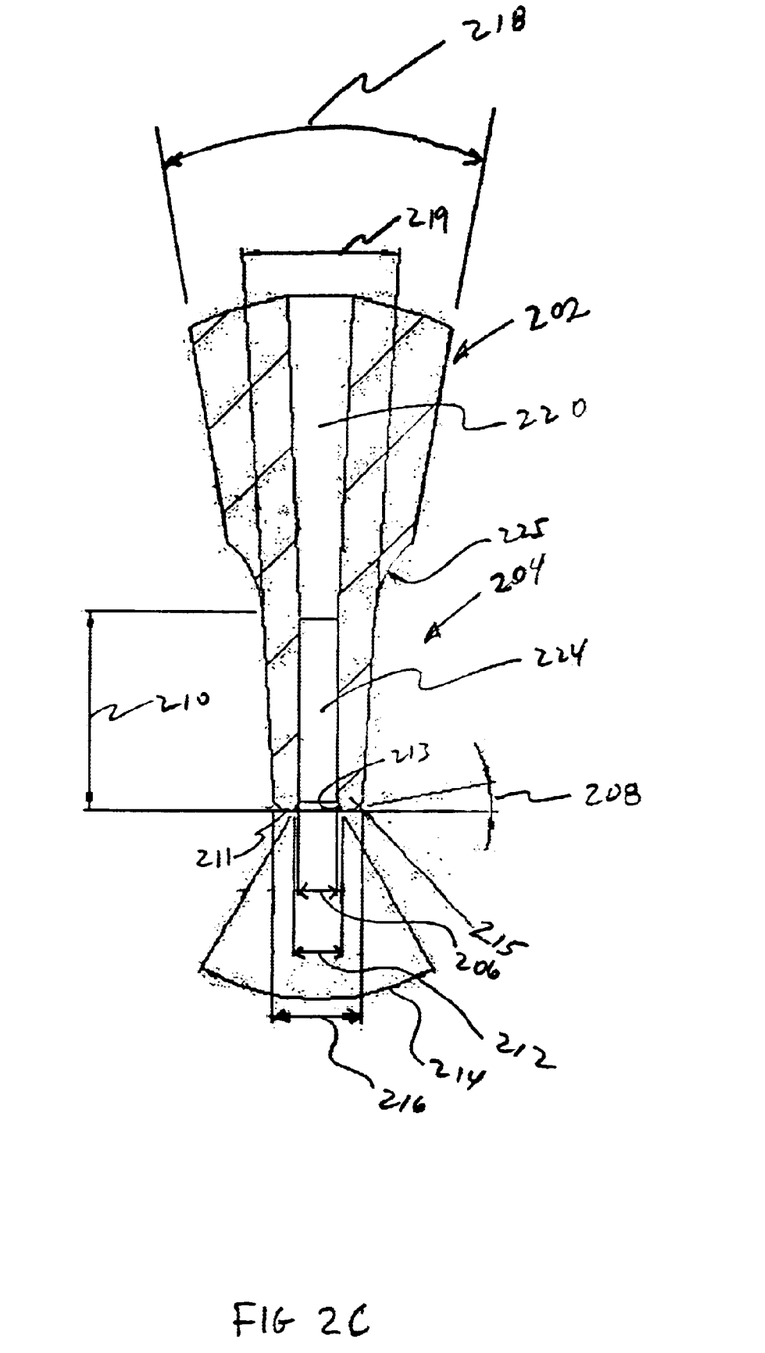

FIG. 2B is a sectional side view of bonding tool 200. As shown in FIG. 2B, bonding tool 200 has a diameter 227 of between about 1.5 and 1.6 mm and preferably about 1.588 mm. Further, bonding tool 200 has a length of between about 9.5 and 11.1 mm. Tapered portion 202 has a substantially constant taper 218 of between about 18° and 22° starting from the point at which it meets cylindrical section 201. In one exemplary embodiment, the taper is between about 19° and 21°, and preferably 20°. Axial passage 220 extends from upper end 222 to working tip 204 of bonding tool 200. In an exemplary embodiment, axial passage 220 has a substantially continuous tapered shape having a predetermined angle 226 of about 13°±1° over a portion of its length. As the axial passage 220 approaches working tip 204, this taper transitions to about 6°±1°. The invention is not so limited, however, and it is contemplated that axial passage 220 may be have a substantially constant diameter or tapered over only a portion of the length of bonding tool 200. The latter may be desired in order to facilitate wire insertion at upper end 222 of bonding tool 200. Examples of such alternate axial passages are illustrated in FIGS. 2D and 2E.

Figure 2D:
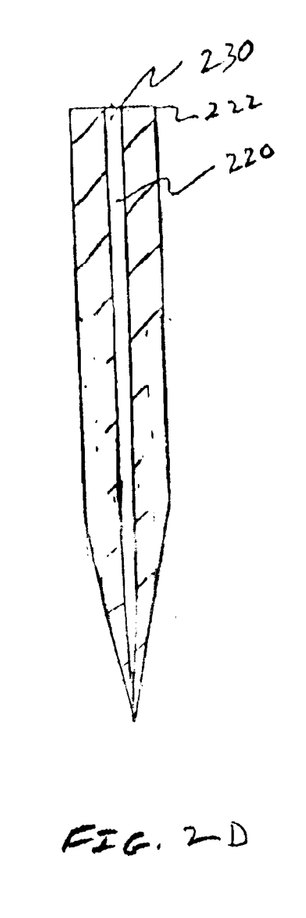
Figure 2E:
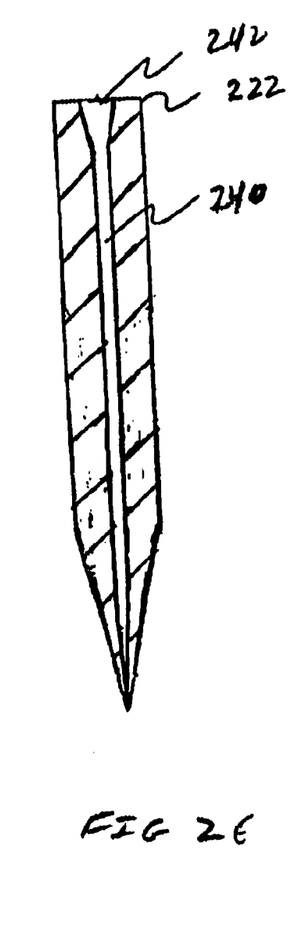

As shown in FIG. 2D, axial passage 220 has a substantially constant diameter 230 along the length of bonding tool 200. In FIG. 2E, axial passage 220 has a substantially constant diameter 240 along a portion of the length of bonding tool 200, and has a taper 242 adjacent upper end 222 of bonding tool 200.

Figure 2F:
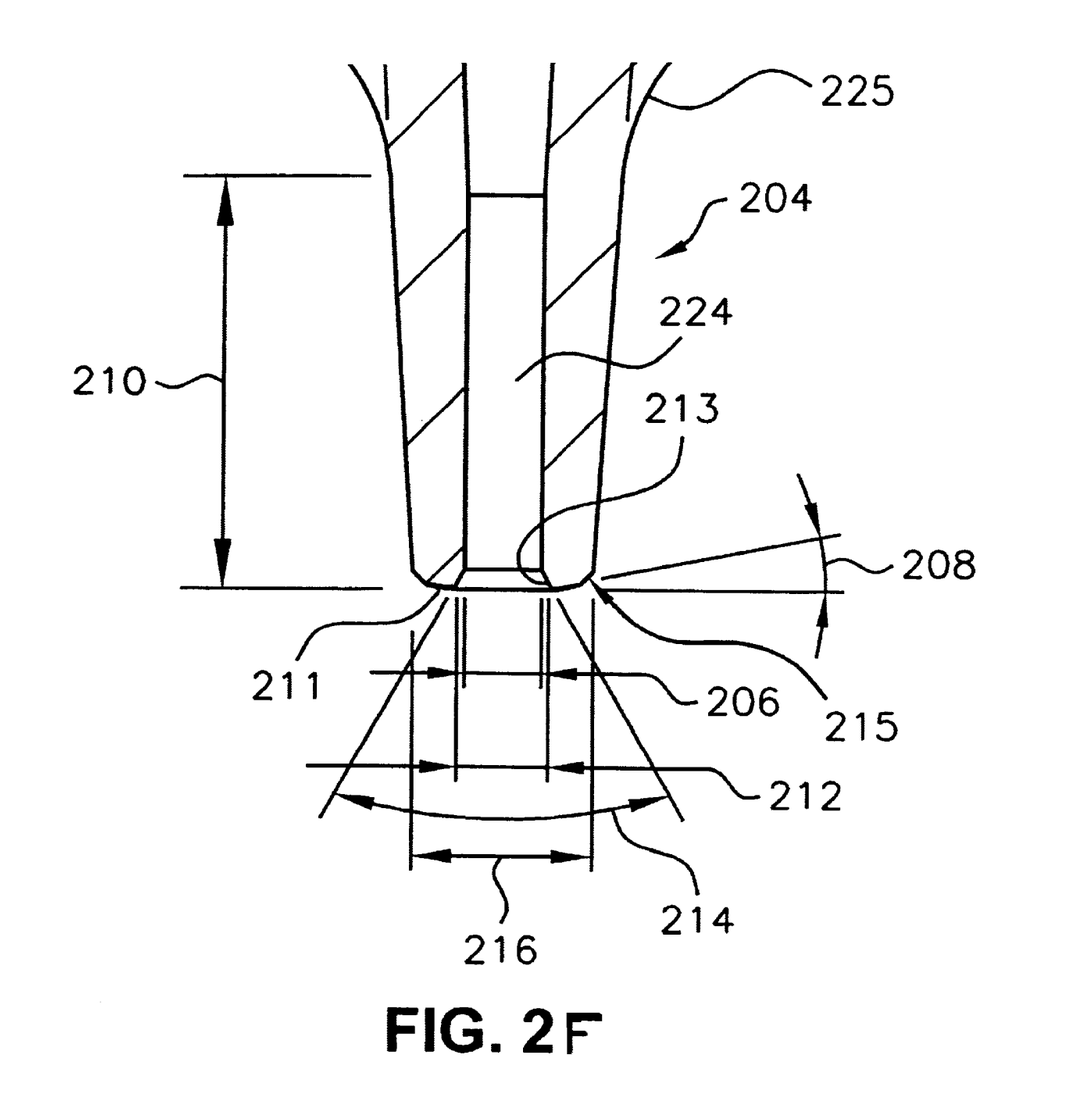

FIGS. 2C and 2F are detailed sectional views of working tip 204 of bonding tool 200. As shown in FIGS. 2C and 2F, working tip 204 has an annular working face 211 forming, i.e., an outer annular chamfer having a face angle 208 of between 8 and 15 degrees. In one exemplary embodiment, face angle 208 is at least 11, preferably between 11 and 12 degrees, and most preferably 11 degrees, to provide a strong second bond (wedge bond) by the bonding tool. Adjacent outer annular chamfer 211 is inner annular chamfer 213 having an overall angle 214 of less than 90 degrees. In a preferred embodiment, chamfer angle 214 is between 60 and 90 degrees, and most preferably about 60 degrees, in order to provide a first bond (ball bond) that meets shear and pull test requirements. In addition, inner annular chamfer 213 has a width of between 1 and 4 microns. Cylindrical passage 224 is coupled between the upper portion of chamfer 213 and axial passage 220. In one exemplary embodiment, cylindrical passage 224 has a diameter 206 of about 14 microns to accommodate a bonding wire (not shown), chamfer 213 has an outer diameter 212 of about 18 microns, and working tip 204 has a diameter 216 of about 33 microns. Diameter 206 of cylindrical passage 224 may be determined based on the diameter of the bonding wire plus 4 microns. Further, as shown in FIG. 2C, working tip 204 has a substantially constant taper 219 of between about 0 and 10 degrees and preferably about 7 degrees to avoid contact of adjacent bonding wires by bonding tool 200, and a length 210 of between about 60 and 90 microns. In a preferred embodiment length 210 is about 76.2 microns.

As the taper angles 218 and 219 of tapered portion 202 and working tip 204, respectively, are different, a transition region 225 may be placed between tapered portion 202 and working tip 204. In a preferred embodiment, transition region 225 has a radius of about 3.8 microns. Further, in order to prevent chipping of bonding tool 200, a transition region 315 having a radius of between about 4 and 6 microns may be disposed between the lower portion of working tip 204 and outer annual chamfer 211.

Figure 3A:
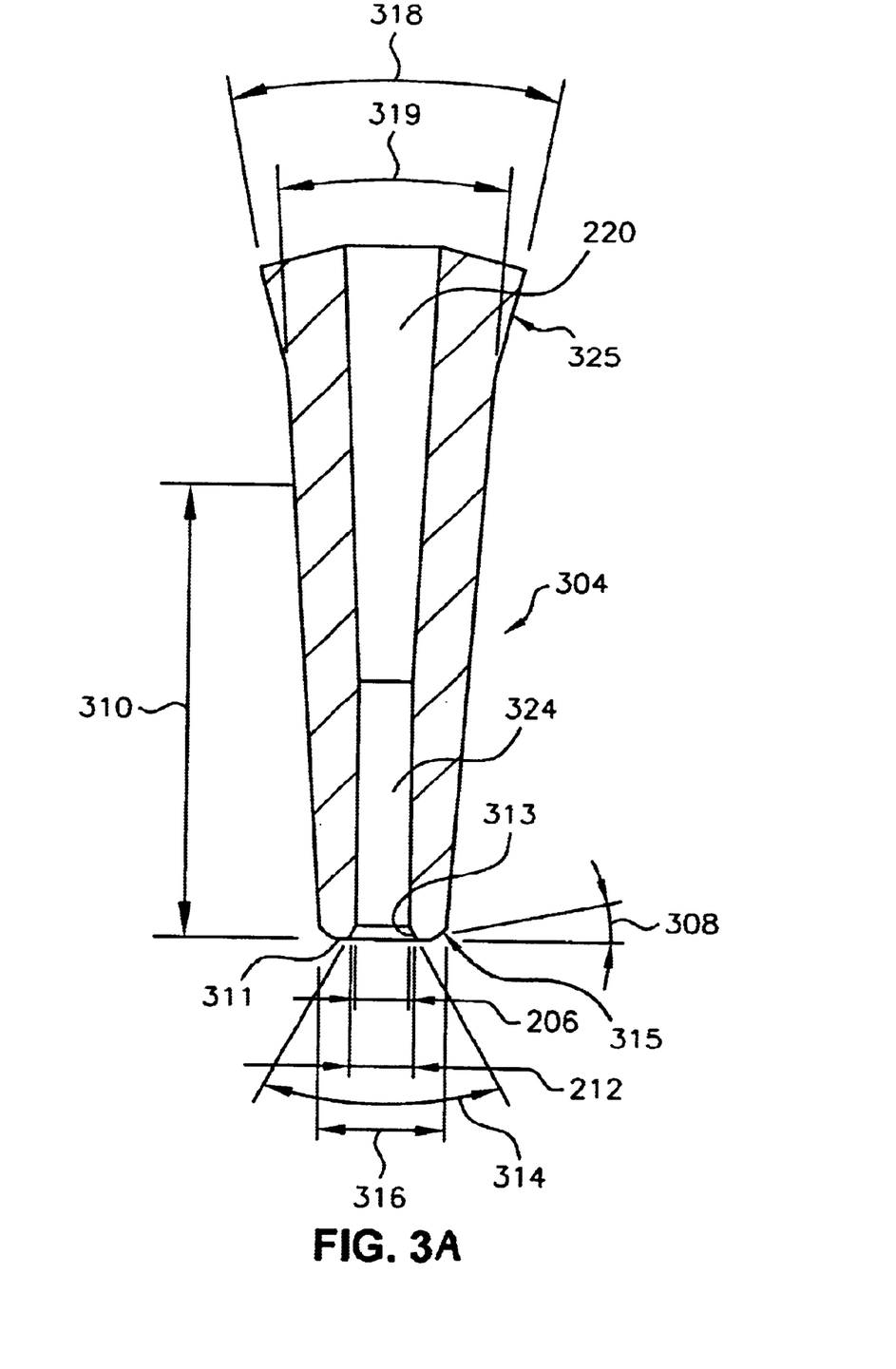
FIGS. 3A–3B are detailed sectional views of the working tip of a bonding tool according to a second exemplary embodiment of the present invention.
Figure 3B:
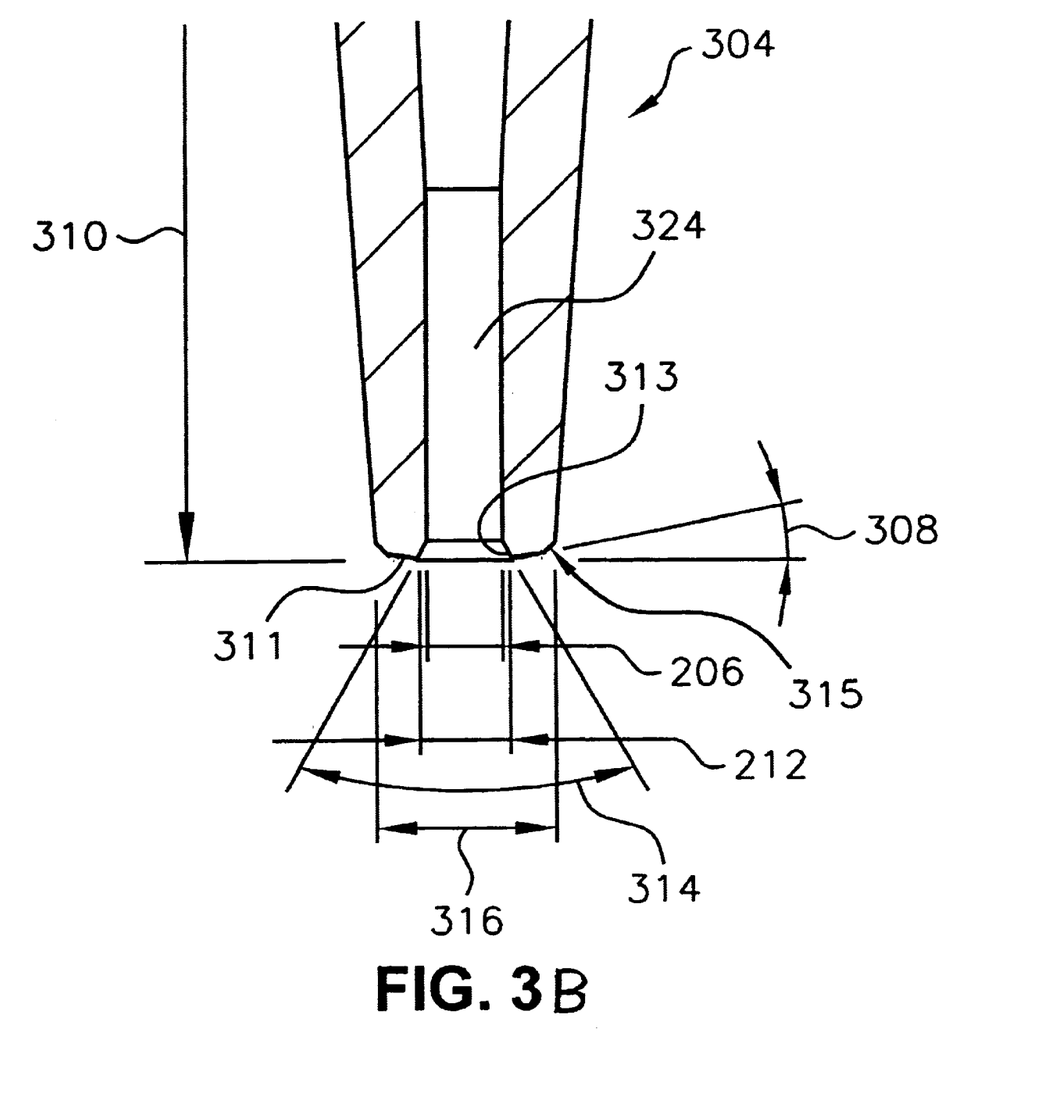

FIGS. 3A and 3B are detailed sectional views of working tip 304 according to another exemplary embodiment of the present invention. As the cylindrical body portion, tapered portion and axial passage of the bonding tool in this exemplary embodiment are essential identical to that of the first exemplary embodiment descriptions related thereto are not repeated.

As shown in FIGS. 3A and 3B, working tip 304 has a working face 311 forming, i.e., an outer annular chamfer having a face angle 308 of between 8 and 15 degrees. In one exemplary embodiment, face angle 308 is between about 10 and 12 degrees and preferably 11 degrees. Adjacent outer annular chamfer 311 is inner annular chamfer 313 having an overall angle 314 of less than 90 degrees. In a preferred embodiment, chamfer angle 314 is between 60 and 90 degrees, and most preferably about 60 degrees. In addition, annular chamfer 313 has a width of between 1 and 3 microns. Cylindrical passage 324 is coupled between the upper portion of chamfer 313 and axial passage 220. In one exemplary embodiment, cylindrical passage 324 has a diameter 306 of between about 14 and 16 microns and preferably about 15 microns to accommodate a bonding wire (not shown), chamfer 313 has an outer diameter 312 of between about 17 and 19 microns and preferably about 18 microns, and working tip 304 has a outer diameter 316 of between about 37 and 39 microns, and preferably about 38 microns. Diameter 306 of cylindrical passage 324 may be determined based on the diameter of the bonding wire plus 2 microns. Further, as shown in FIG. 3A, working tip 304 has a substantially constant taper 319 of between about 0 and 10 degrees and preferably about 7 degrees to avoid contact of adjacent bonding wires by bonding tool 200, and a length 310 of between about 117 and 137 microns. In a preferred embodiment length 310 is about 127 microns.

Providing a bonding tool such as that described above is merely half the battle in meeting the needs of the semiconductor industry. It is important to be able to form the bonding tool form a material that is sufficiently strong to withstand the forces exerted on the tool during the bonding process, yet resilient enough to flex as needed without breaking. The inventors have determined that by forming the bonding tool from at least 80% Zirconia ($ZrO_2$) by weight these needs are met.

In one embodiment of the present invention, Yttria stabilized Zirconia is used to form the bonding tool. In this embodiment, about 95% by weight of Zirconia is combined with about 5% by weight of $Y_2O_3$. The inventors have determined that pure Zirconia undergoes a phase transformation process during heat treatment. Pure Zirconia is monoclinic at room temperature and changes to a denser tetragonal form at about 1000 C. This involves a large volume change and creates cracks within its structures during the sintering process at a temperature of between about 1350 and 1500° C.

Additional amounts of $Y_2O_3$ create a mixture of the cubic phase and the monoclinic phase at low temperatures, such as less than 900° C. This phase transformation process that takes place with the presence of the cubic phase and involves with much less volume change, which, in turn, reduces the thermal stresses and minimizes the formation of microcracks. This material has a much higher bending strength than conventional Alumina based materials, and, as a result, improves the manufacturing capabilities of the bonding tool.

In another exemplary embodiment, up to 20% $AL_2O_3$ by weight is added to the Yttria stabilized Zirconia. This material has an acoustic behavior similar to that of conventional Alumina based materials.

Although the invention has been described with reference to exemplary embodiments, it is not limited thereto. Rather, the appended claims should be construed to include other variants and embodiments of the invention which may be made by those skilled in the art without departing from the true spirit and scope of the present invention.

What is claimed:

1. A bonding tool for bonding a fine wire to a substrate, the bonding tool comprising:
   a working tip at an end of the bonding tool including:
      i) a tapered section having a predetermined angle with respect to the longitudinal axis of the bonding tool,
      ii) a working face with a first annular chamfer formed at an outside portion of an end of the working tip, and
      iii) a second annular chamfer formed at an inner portion of the end of the working tip, the first and second annular chamfer adjacent one another; and
   a substantially cylindrical axial passage coupled to an upper end of the second annular chamfer,
      wherein the bonding tool is formed from a material containing about 95% $ZrO_2$ by weight and about 5% $Y_2O_3$ by weight.

2. The bonding tool according to claim 1, wherein the second annular chamfer has an overall angle of less than 90°.

3. The bonding tool according to claim 2, wherein the first annular chamfer has a face angle of greater than 8°.

4. The bonding tool according to claim 1, wherein the second annular chamfer has an overall angle of about 60°.

5. The bonding tool according to claim 4, wherein the first annular chamfer has a face angle of between about 10° and 12°.

6. The bonding tool according to claim 1, wherein the axial passage has a diameter of less than about 16 microns.

7. The bonding tool according to claim 1, wherein the tapered section has a length of less than about 137 microns.

8. The bonding tool according to claim 7, wherein the tapered section has an outside diameter of less than about 39 microns.

9. The bonding tool according to claim 1, wherein the material that forms the bonding tool includes $Al_2O_3$.

10. The bonding tool according to any one of claims 1 and 9, wherein the material is sintered at a temperature of at least 1350° C.

11. The bonding tool according to claim 1, wherein the bonding tool is formed from a unitary piece of material.

12. The bonding tool according to claim 1, wherein an overall angle of the tapered section is less than 10°.

13. The bonding tool according to claim 1, wherein an overall angle of the tapered section is about 7°.

14. A bonding tool for bonding a fine wire to a substrate, the bonding tool comprising:
   a cylindrical section having a diameter;
   a first tapered section coupled to an end of the cylindrical section, and having a first predetermined angle with respect to a longitudinal axis of the cylindrical section;
   a second tapered section having i) a second predetermined angle with respect to the longitudinal axis of the cylindrical section, ii) a first chamfer formed at an outside portion of an end thereof, and iii) a second chamfer formed at an inside portion of an end thereof, the second tapered section coupled to an end of the first tapered section; and
   an axial passage extending from a first end of cylindrical section to the second chamfer
      wherein the bonding tool is formed from a material containing about 95% $ZrO_2$ by weight and about 5% $Y_2O_3$ by weight.

15. The bonding tool according to claim 14, further comprising a third taped section disposed between the first tapered section and the second tapered section.

16. The bonding tool according to claim 14, wherein the second chamfer has an angle of less than 90°.

17. The bonding tool according to claim 14, wherein the second chamfer has an angle of about 60°.

18. The bonding tool according to claim 14, wherein the first chamfer has a face angle of between about 10° and 12°.

19. The bonding tool according to claim 14, wherein the axial passage has a first diameter at a first end of the first cylindrical section and a second diameter at a tip of the second tapered section, the first diameter greater than the second diameter.

20. The bonding tool according to claim 14, wherein the first predetermined angle of the first tapered section is between about 19° and 21°.

21. The bonding tool according to claim 14, wherein the first predetermined angle is about 20°.

22. The bonding tool according to claim 14, wherein the second predetermined angle of the second tapered section is about 7°.

23. The bonding tool according to claim 14, wherein the second predetermined angle of the second tapered section is less than 10°.

24. A bonding tool for bonding a fine wire to a substrate, the bonding tool comprising:
   a cylindrical section having a diameter;
   a first tapered section coupled to an end of the cylindrical section, and having a first predetermined angle with respect to a longitudinal axis of the cylindrical section; and
   a second tapered section coupled to an end of the first tapered section, the second tapered section having:
      i) a length of between about 117 microns and 137 microns,
      ii) an angle of about 7° with respect to the longitudinal axis of the cylindrical section, and
      iii) an annular chamfer of about 60° formed at an inside portion of the second tapered section and adjacent an end thereof,
         wherein the bonding tool is formed from a material containing about 95% $ZrO_2$ by weight and about 5% $Y_2O_3$ by weight.

25. The bonding tool according to claim 24, wherein the material that forms the bonding tool includes $Al_2O_3$.

26. A method for making a bonding tool for bonding a wire to a bonding pad, comprising the steps of:
   forming a working tip at an end of the bonding tool;
   forming a tapered section on the working tip having a predetermined angle with respect to the longitudinal axis of the bonding tool;
   forming a working face at an end of the working tip;
   forming a first annular chamfer having a face angle of at least 8° at an outside portion of an end of the working tip;
   forming a second annular chamfer having an overall angle of less than 90° at an inner portion of the end of the working tip and adjacent the first annular chamfer; and
   forming a substantially cylindrical axial passage at an upper end of the second annular chamfer,
      wherein the bonding tool is formed from a material containing about 95% $ZrO_2$ by weight and about 5% $Y_2O_3$ by weight.

27. The bonding tool according to claim 1, wherein the bonding tool has an overall length of between about 9.5 and 11.1 mm.

28. The bonding tool according to claim 14, wherein the bonding tool has an overall length of between about 9.5 and 11.1 mm.

29. The bonding tool according to claim 24, wherein the bonding tool has an overall length of between about 9.5 and 11.1 mm.

30. A bonding tool for bonding a fine wire to a substrate, the bonding tool comprising:
   a working tip at an end of the bonding tool including:
      i) a working face with an outer annular chamfer formed at an outside portion of an end of the working tip, and
      ii) a single inner annular chamfer formed at an inner portion of the end of the working tip, the outer annular chamfer and the inner annular chamfer immediately adjacent one another; and
   a single axial passage coupled to an upper end of the inner annular chamfer and extending to an opposite end of the bonding tool,
      wherein the bonding tool is formed from a material containing about 95% $ZrO_2$ by weight and about 5% $Y_2O_3$ by weight.

31. A bonding tool for bonding a fine wire to a substrate, the bonding tool comprising:
   a working tip at an end of the bonding tool including:
      i) a working face with a single outer annular chamfer formed at an outside portion of an end of the working tip, and
      ii) a single inner annular chamfer formed at an inner portion of the end of the working tip, the single outer annular chamfer directly coupled to a lower end of the single inner annular chamfer; and
   an axial passage directly coupled to an upper end of the inner annular chamfer and extending to an opposite end of the bonding tool,
      wherein the bonding tool is formed from a material containing about 95% $ZrO_2$ by weight and about 5% $Y_2O_3$ by weight.

32. A bonding tool for bonding a fine wire to a substrate, comprising:
   about 95% $ZrO_2$ by weight; and
   about 5% $Y_2O_3$ by weight.

* * * * *

UNITED STATES PATENT AND TRADEMARK OFFICE
CERTIFICATE OF CORRECTION

PATENT NO. : 6,715,658 B2
DATED : April 6, 2004
INVENTOR(S) : Perlberg et al.

It is certified that error appears in the above-identified patent and that said Letters Patent is hereby corrected as shown below:

<u>Title page,</u>
Item [75], Inventors, "Ziv Atsmon" should read -- Ziv Atzmon --; "Arie Bahalui" should read -- Arie Bahalul --

Signed and Sealed this

Eighth Day of March, 2005

JON W. DUDAS
*Director of the United States Patent and Trademark Office*